US009627070B2

(12) United States Patent
Koo et al.

(10) Patent No.: US 9,627,070 B2
(45) Date of Patent: Apr. 18, 2017

(54) PROGRAM METHOD OF NONVOLATILE MEMORY DEVICE FOR HAVING DENSE THRESHOLD VOLTAGE DISTRIBUTION BY CONTROLLING VOLTAGE OF BIT LINE ACCORDING TO THRESHOLD VOLTAGE OF MEMORY CELL

(71) Applicant: SK hynix Inc., Icheon-si, Gyeonggi-do (KR)

(72) Inventors: Cheul Hee Koo, Icheon-si (KR); Byoung Young Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 14/735,397

(22) Filed: Jun. 10, 2015

(65) Prior Publication Data

US 2015/0279469 A1 Oct. 1, 2015

Related U.S. Application Data

(62) Division of application No. 13/340,961, filed on Dec. 30, 2011, now Pat. No. 9,082,487.

(30) Foreign Application Priority Data

Sep. 26, 2011 (KR) ........................ 10-2011-0096807

(51) Int. Cl.
*G11C 16/10* (2006.01)
*G11C 16/26* (2006.01)
*G11C 16/06* (2006.01)
*G11C 16/34* (2006.01)
*G11C 16/24* (2006.01)

(52) U.S. Cl.
CPC ............. *G11C 16/10* (2013.01); *G11C 16/06* (2013.01); *G11C 16/24* (2013.01); *G11C 16/26* (2013.01); *G11C 16/3454* (2013.01)

(58) Field of Classification Search
CPC ......... G11C 16/10; G11C 16/24; G11C 16/06; G11C 16/3454; G11C 16/26
See application file for complete search history.

(56) References Cited

U.S. PATENT DOCUMENTS

| 6,288,936 B1 * | 9/2001 | Kawamura ......... G11C 11/5621 365/185.03 |
| 7,286,406 B2 | 10/2007 | Lutze et al. |
| 7,433,240 B2 * | 10/2008 | Kim .................... G11C 7/1021 365/185.11 |
| 7,515,477 B2 | 4/2009 | Cha et al. |

(Continued)

FOREIGN PATENT DOCUMENTS

| CN | 101488367 A | 7/2009 |
| KR | 1020100027782 A | 3/2010 |

*Primary Examiner* — Khamdan Alrobaie
(74) *Attorney, Agent, or Firm* — William Park & Associates Ltd.

(57) ABSTRACT

A program method of a nonvolatile memory device includes a pre-program verify step for verifying a threshold voltage of a selected memory cell; a step of setting a bit line voltage of the selected memory cell according to the threshold voltage of the selected memory cell which is determined through the pre-program verify step; a step of applying a program voltage to the selected memory cell set with the bit line voltage; and a post-program verify step for verifying a programmed state of the selected memory cell applied with the program voltage.

14 Claims, 8 Drawing Sheets

(56) References Cited

U.S. PATENT DOCUMENTS

| | | | |
|---|---|---|---|
| 8,395,940 B2* | 3/2013 | Huh | G11C 16/06 |
| | | | 365/185.12 |
| 2004/0141377 A1* | 7/2004 | Arai | G11C 16/0483 |
| | | | 365/185.22 |
| 2006/0158922 A1 | 7/2006 | Takemura | |
| 2007/0217254 A1 | 9/2007 | Matsuoka et al. | |
| 2008/0074918 A1 | 3/2008 | Ro et al. | |
| 2008/0137403 A1 | 6/2008 | Matsuoka et al. | |
| 2008/0158971 A1* | 7/2008 | Lee | G11C 16/3418 |
| | | | 365/185.17 |
| 2009/0040816 A1 | 2/2009 | Kang et al. | |
| 2009/0073753 A1 | 3/2009 | Osada et al. | |
| 2010/0182841 A1* | 7/2010 | Lee | G11C 16/24 |
| | | | 365/185.21 |
| 2010/0309725 A1* | 12/2010 | Huh | G11C 16/06 |
| | | | 365/185.12 |
| 2010/0329031 A1* | 12/2010 | Lee | G11C 11/5628 |
| | | | 365/185.22 |

\* cited by examiner

PROGRAM METHOD OF NONVOLATILE MEMORY DEVICE FOR HAVING DENSE THRESHOLD VOLTAGE DISTRIBUTION BY CONTROLLING VOLTAGE OF BIT LINE ACCORDING TO THRESHOLD VOLTAGE OF MEMORY CELL

CROSS-REFERENCES TO RELATED APPLICATION

The present application claims priority under 35 U.S.C. §119(a) to Korean application number 10-2011-0096807, filed on Sep. 26, 2011, in the Korean Intellectual Property Office, which is incorporated herein by reference in its entirety as set forth in full.

BACKGROUND

1. Technical Field

The present invention relates to a nonvolatile memory device, and more particularly, to a program method of a nonvolatile memory device.

2. Related Art

Semiconductor memory devices are generally divided into a volatile memory device and a nonvolatile memory device. While the volatile memory device loses stored data when power supply is interrupted, the nonvolatile memory device can retain stored data even though power supply is interrupted. Nonvolatile memory devices include various types of memory cell transistors where the category of devices may be divided based upon a structure of a memory cell transistor. Nonvolatile memory devices are divided into a flash memory device, a ferroelectric RAM (FRAM), a magnetic RAM (MRAM), a phase change RAM (PRAM).

Among nonvolatile memory devices, flash memory devices are generally divided into a NOR flash memory device and a NAND flash memory device, depending upon a connection state of memory cells and a bit line. The NOR flash memory device has a structure in which two or more memory cell transistors are connected in parallel to one bit line. Accordingly, the NOR flash memory device has excellent characteristics in terms of random access time. Conversely, the NAND flash memory device has a structure in which two or more memory cell transistors are connected in series to one bit line. This structure is referred to as a cell string structure. One bit line contact is needed per a cell string. Therefore, the NAND flash memory device has excellent characteristics in terms of the degree of integration.

The memory cells of a flash memory device are divided into on cells and off cells depending upon a threshold voltage distribution. The on cells are erased cells, and the off cells are programmed cells. In order to program a memory cell of a flash memory device, a ground voltage (that is, 0V) is applied to the bit line which is connected to the memory cell, and a high voltage is applied to the word line which is connected to the memory cell. As these voltages are applied to the bit line and the word line of the memory cell to be programmed, the memory cell is programmed through F-N (Fowler-Nordheim) tunneling. Such a program method of a flash memory device is disclosed in detail in Korean Patent No. 10-0842758 which is incorporated herein by reference.

SUMMARY

A nonvolatile memory device with improved reliability, a program method thereof and a data processing system including the same are described herein.

In one embodiment of the present invention, a program method of a nonvolatile memory device includes: a pre-program verify step for verifying a threshold voltage of a selected memory cell; a step of setting a bit line voltage of the selected memory cell according to the threshold voltage of the selected memory cell which is determined through the pre-program verify step; a step of applying a program voltage to the selected memory cell set with the bit line voltage; and a post-program verify step for verifying a programmed state of the selected memory cell applied with the program voltage.

In another embodiment of the present invention, a nonvolatile memory device includes: a memory cell connected with a bit line; and a data input/output circuit configured to precharge the bit line of the memory cell, discharge the precharged bit line according to a threshold voltage of the memory cell, and maintain a voltage of the discharged bit line or apply a program inhibition voltage to the bit line depending upon data to be stored in the memory cell, in a program operation.

In another embodiment of the present invention, a data processing system includes: a nonvolatile memory device; and a controller configured to control the nonvolatile memory device, the nonvolatile memory device comprising a memory cell array including a memory cell disposed at a region where a word line and a bit line cross each other; a control logic configured to control a program operation and a read operation for the memory cell; and a data input/output circuit configured to precharge a bit line of the memory cell under the control of the control logic, discharge the precharged bit line according to a threshold voltage of the memory cell, and maintain a voltage of the discharged bit line or apply a program inhibition voltage to the bit line depending upon data to be stored in the memory cell, in the program operation.

BRIEF DESCRIPTION OF THE DRAWINGS

Features, aspects, and embodiments are described in conjunction with the attached drawings, in which.

DETAILED DESCRIPTION

In the present invention, advantages, features and methods for achieving them will become more apparent after a reading of the following example embodiments taken in conjunction with the drawings. Embodiments of the present invention may, however, be embodied in different forms and should not be construed as being limited to the embodiments set forth herein. Rather, these embodiments are provided to describe the present invention in detail to the extent that a person skilled in the art to which the invention pertains can easily understand technical concepts of the present invention.

It is to be understood herein that embodiments of the present invention are not limited to the particulars shown in the drawings and that the drawings are not necessarily to scale and in some instances proportions may have been exaggerated in order to more clearly depict certain features of disclosed embodiments. While particular terminology is used herein, it is to be appreciated that the terminology used herein is for the purpose of describing particular embodiments only and is not intended to limit the scope of the present invention.

As used herein, the term "and/or" includes any and all combinations of one or more of the associated listed items. It will be understood that when an element is referred to as being "connected to" or "coupled to" another element, it may be directly on, connected or coupled to the other element or intervening elements may be present. As used herein, a singular form is intended to include plural forms as well, unless the context clearly indicates otherwise. It will be further understood that the terms "includes" and/or "including," when used in this specification, specify the presence of at least one stated feature, integer, step, operation, element, and/or component, but do not preclude the presence or addition of one or more other features, integers, steps, operations, elements, components, and/or groups thereof.

Hereinafter, a nonvolatile memory device with improved reliability, a program method thereof and a data processing system including the same according to embodiments of the present invention will be described below with reference to the accompanying drawings through example embodiments.

Figure 1:
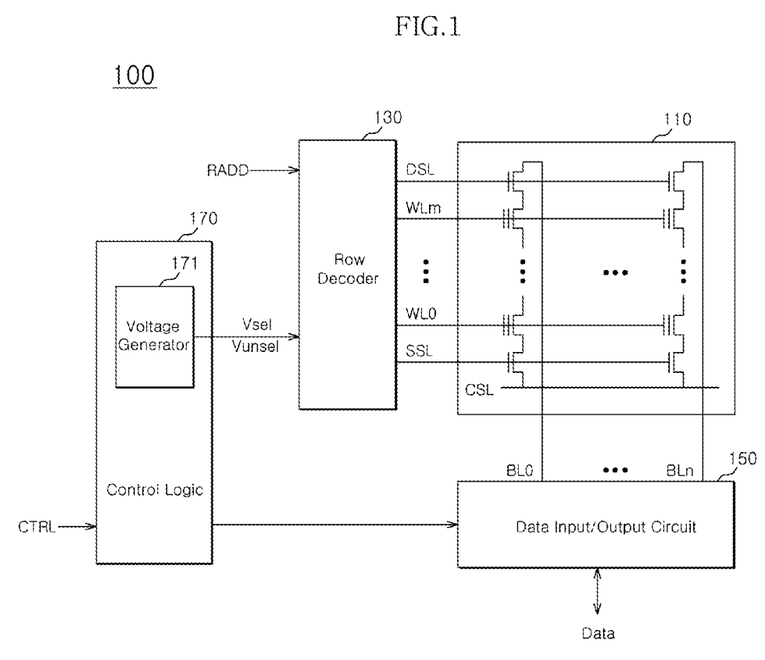
FIG. 1 is a block diagram exemplifying a nonvolatile memory device in accordance with an embodiment of the present invention.

FIG. 1 is a block diagram showing a nonvolatile memory device in accordance with an embodiment of the present invention. Referring to FIG. 1, a nonvolatile memory device 100 includes a memory cell array 110, a row decoder 130, a data input/output circuit 150, and a control logic 170.

The memory cell array 110 includes a plurality of memory cells which are disposed at crossing regions of bit lines BL0 to BLn and word lines WL0 to WLm. Each memory cell stores at least one bit. For example, each memory cell may store one bit; such a memory cell may be called a single level cell (SLC). In another example, each memory cell may store data of two or more bits; such a memory cell is called a multi-level cell (MLC). The multi-level cell is programmed to have a threshold voltage which corresponds to any one of an erased state and a plurality of programmed states depending upon multi-bit data.

The row decoder 130 is configured to select the word lines WL0 to WLm in response to a row address RADD. The row decoder 130 transmits various word line voltages provided from a voltage generator 171 to selected word lines. For example, in a program operation, the row decoder 130 transmits a selected word line voltage Vsel (for example, a program voltage) to a selected word line and an unselected word line voltage Vunsel (for example, a pass voltage) to an unselected word line.

The data input/output circuit 150 is configured to operate under control of the control logic 170. The data input/output circuit 150 operates as a write driver or a sense amplifier depending upon an operation mode. For example, the data input/output circuit 150 stores data inputted through a data input/output buffer (not shown) to a memory cell of the memory cell array 110 in a program operation. In another example, the data input/output circuit 150 outputs data read from a cell of the memory cell array 110 through a data input/output buffer (not shown) in a read operation. The data input/output circuit 150 may include a plurality of data input/output circuits which are respectively connected to the bit lines BL0 to BLn. For this reason, the bit lines BL0 to BLn are selected or controlled by the respective data input/output circuits 150.

The control logic 170 is configured to control general operations of the nonvolatile memory device 100 in response to a control signal CTRL provided from an external device (for example, a memory controller, a memory interface or a host device). For example, the control logic 170 controls read, program (or write) and erase operations of the nonvolatile memory device 100. For such an operation, the control logic 170 controls the voltage generator 171 and the data input/output circuit 150.

According to an embodiment of the present invention, the control logic 170 performs a control operation such that a bit line of a selected memory cell, which is precharged, is discharged according to a threshold voltage of the selected memory cell in a program operation. The control logic 170 controls a programming operation for applying a program voltage to a selected memory cell in a program operation. Further, the control logic 170 controls a program verify operation for verifying a programmed state of a selected memory cell after a program voltage is applied. In an embodiment of the present invention, a program verify operation for discharging a bit line according to the threshold voltage of the selected memory cell before the program voltage is applied is defined as a pre-program verify operation. Also, a program verify operation for verifying the programmed state of the selected memory cell after the program voltage is applied is defined as a post-program verify operation.

Through the pre-program verify operation, the voltage of a bit line of a selected memory cell is set depending upon the threshold voltage of the selected memory cell. Since the voltage of the bit line of the selected memory cell may be set according to the threshold voltage distribution of the selected memory cell, an F-N tunneling effect occurring between the gate and a channel of the selected memory cell may be controlled. For this reason, the selected memory cell may be programmed to have a dense threshold voltage distribution. Such a pre-program verify operation will be described later in detail with reference to FIGS. 3 to 6.

The pre-program verify operation, the programming operation and the post-program verify operation form one program loop. The selected memory cell is programmed to a target program state through a plurality of program loops. The program voltage is increased by a preset value each time the program loop is repeated. That is to say, the program operation may be performed as an incremental step pulse program (ISPP).

Figure 2:
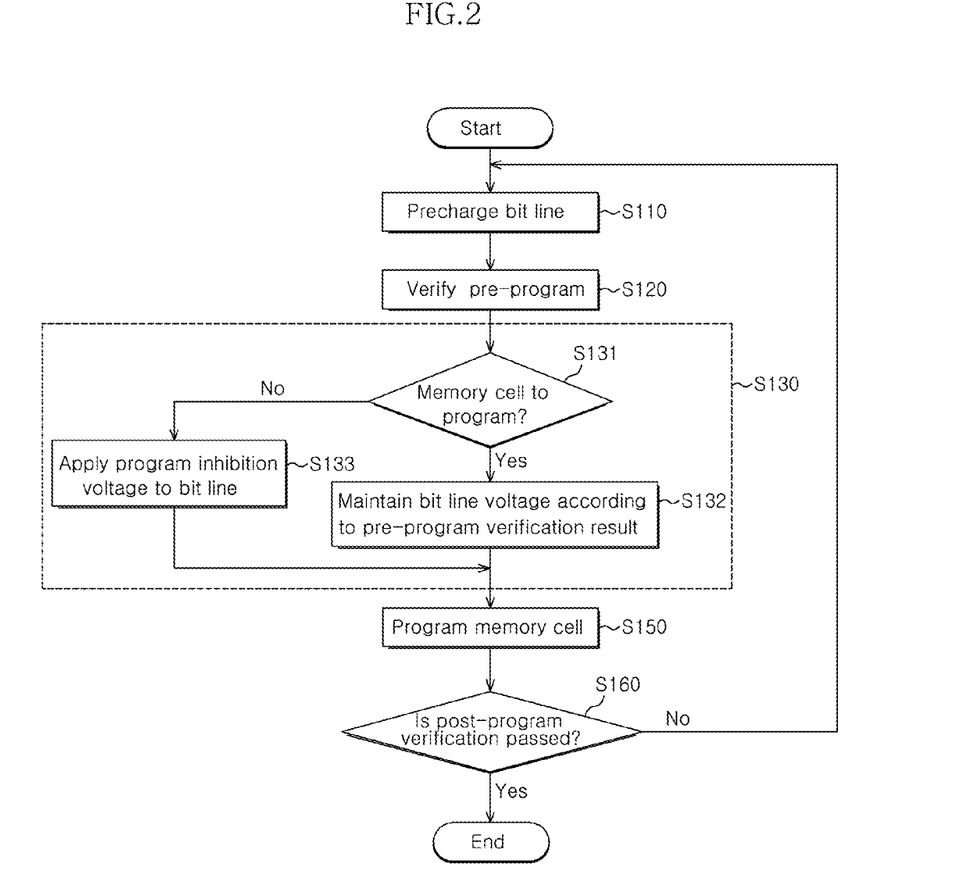
FIG. 2 is a flow chart exemplifying a program method of a nonvolatile memory device in accordance with another embodiment of the present invention.

FIG. 2 is a flow chart exemplifying a program method of a nonvolatile memory device in accordance with another embodiment of the present invention. According to the other embodiment of the present invention, a program operation of a nonvolatile memory device includes a bit line precharge operation, a pre-program verify operation, a bit line set-up operation, a programming operation and a post-program verify operation. Hereafter, the program method of a nonvolatile memory device in accordance with another embodiment of the present invention will be described in detail with reference to FIGS. 1 and 2.

First, in step S110, the bit line of a selected memory cell is precharged. For example, the data input/output circuit 150 precharges the bit line of the selected memory cell to a predetermined voltage under control of the control logic 170.

In step S120, the pre-program verify operation for the selected memory cell is performed. When the pre-program verify operation is performed, the bit line of the selected memory cell, which was previously precharged, is discharged according to the threshold voltage of the selected memory cell. That is to say, when the pre-program verify operation is performed, the voltage of the bit line of the selected memory cell is set according to the threshold voltage of the selected memory cell. For example, the voltage of the bit line of the selected memory cell is set to a ground voltage (that is, 0V), or to a voltage higher than the ground voltage and lower than a precharge voltage (for example, a power supply voltage (Vcc)).

In step S130, the bit line set-up operation is performed. The bit line set-up operation (the step S130) includes a plurality of sub steps, that is, step S131, step S132 and step S133. The bit line set-up operation (the step S130) is performed according to data to be programmed to the selected memory cell. In detail, in the step S131, whether or not the selected memory cell is a memory cell to be programmed is determined depending upon whether data stored in the data latch circuit of the data input/output circuit 150 indicates that a program or program inhibition should be performed. For example, when program data (for example, data "0") is stored in the data latch circuit of the data input/output circuit 150, the selected memory cell is determined as a memory cell to be programmed, and the procedure proceeds to the step S132. On the contrary, when erase data (for example, data "1") is stored in the data latch circuit of the data input/output circuit 150, the selected memory cell is determined as a program-inhibited memory cell, and the procedure proceeds to the step S133.

In the step S132, the bit line of the selected memory cell is maintained in the state discharged in the step S120. In other words, the voltage of the bit line of the selected memory cell, which was determined as a memory cell to be programmed in step S131, is maintained as the voltage set by the pre-program verify operation. This means that the voltage of the bit line of the selected memory cell, which is determined as a memory cell to be programmed, may be controlled according to the threshold voltage of the selected memory cell. Since F-N tunneling occurring between the gate and the channel of the selected memory cell may be controlled by controlling the voltage of the bit line, the selected memory cell may be programmed to have a dense threshold voltage distribution.

In the step S133, the bit line of the selected memory cell, which is determined as a program-inhibited memory cell, according to the data stored in the data latch circuit of the input/output circuit 150, is applied with a program inhibition voltage regardless of the result of the pre-program verify operation. Because the program inhibition voltage is applied regardless of the pre-program verify operation, step S132 is skipped and step S150 is performed.

In step S150, after the bit line set-up operation is completed, the programming operation for applying a program voltage to the selected memory cell is performed. For example, a selected word line voltage (that is, the program voltage) is applied to the word line connected to the selected memory cell, by which the selected memory cell is programmed. At this time, the selected memory cell determined as a program-inhibited memory cell is inhibited from being programmed by a program inhibition voltage.

In step S160, the post-program verify operation for verifying the programmed state of the selected memory cell after the program voltage is applied is performed. If it is determined through the post-program verify operation that the program of the selected memory cell is completed, the program procedure is completed. However, if it is determined through the post-program verify operation that the program of the selected memory cell is not completed, the steps S110 to S160 are repeated until the program is completed. If it is determined that the program is not completed and the program operation is performed a predetermined number of times, the program procedure is abnormally ended.

Figure 3:
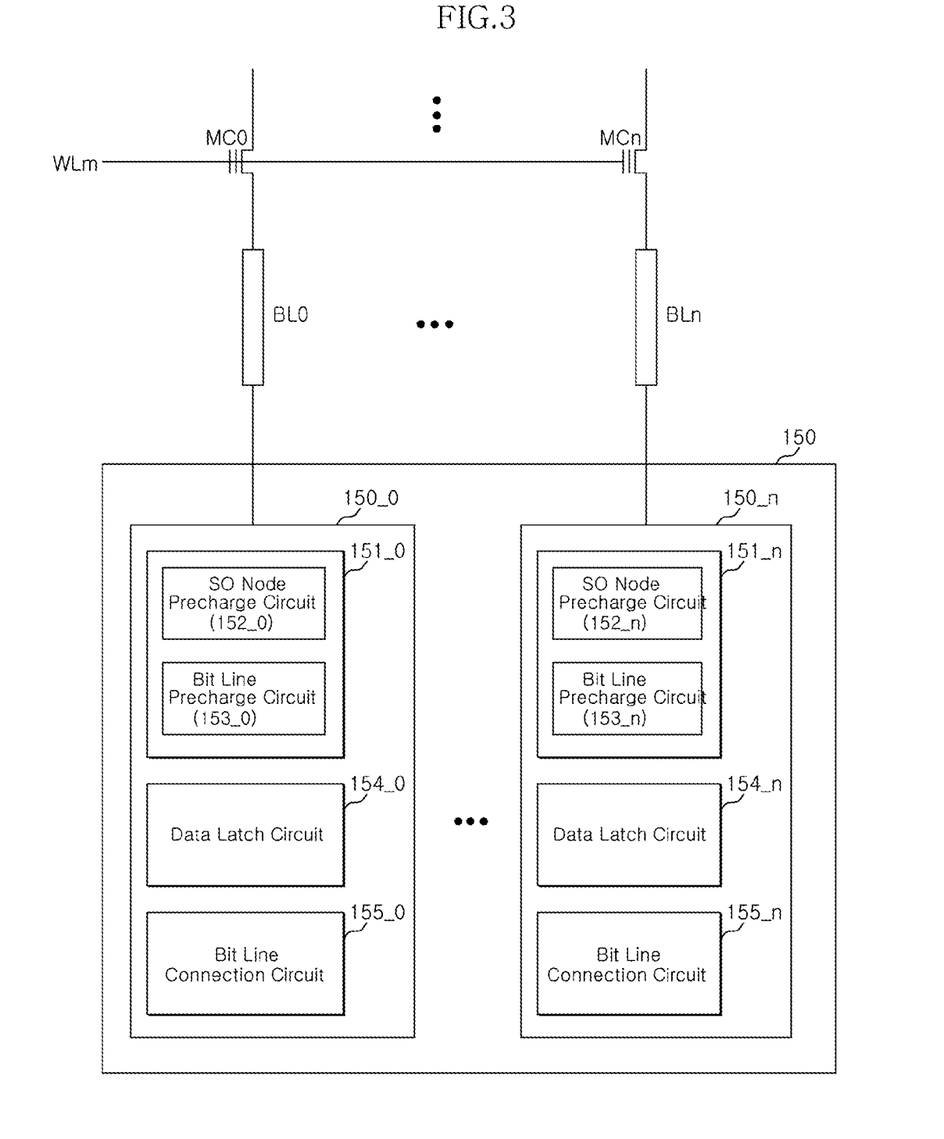
FIG. 3 is a block diagram schematically illustrating a data input/output circuit of a nonvolatile memory device in accordance with an embodiment of the present invention.

FIG. 3 is a block diagram schematically illustrating the data input/output circuit of the nonvolatile memory device in accordance with an embodiment of the present invention. As described above, the data input/output circuit 150 of the nonvolatile memory device 100 includes a plurality of data input/output circuits 150_0 to 150_n which are respectively connected to the bit lines BL0 to BLn. The bit lines BL0 to BLn are selected or controlled by the respective corresponding data input/output circuits 150_0 to 150_n.

The data input/output circuits 150_0 to 150_n have the same configuration. Accordingly, for the sake of convenience in explanation, only one data input/output circuit 150_0 will be described below.

The data input/output circuit 150_0 includes a precharge circuit 151_0, a data latch circuit 154_0, and a bit line connection circuit 155_0. While not shown in the drawing, it may be understood that the data input/output circuit 150_0 may further include a discharge circuit and a plurality of data latch circuits.

The precharge circuit 151_0 includes an SO node precharge circuit 152_0 and a bit line precharge circuit 153_0. The SO node precharge circuit 152_0 is configured to precharge a node (for example, an SO node) through which the precharge circuit 151_0, the data latch circuit 154_0 and the bit line connection circuit 155_0 are connected with one another. The bit line precharge circuit 153_0 is configured to precharge the bit line BL0.

The data latch circuit 154_0 is configured to store data to be programmed to a selected memory cell in a program operation. Further, the data latch circuit 154_0 is configured to store the data of the selected memory cell to be read according to the voltage of a selected word line in a read operation.

The bit line connection circuit 155_0 is configured to control a bit line according to the data stored in the data latch circuit 154_0 in the program operation. For example, when erase data (for example, data "1") is stored in the data latch circuit 154_0, the bit line connection circuit 155_0 controls the bit line such that a program inhibition voltage (that is, a voltage of a logic high state corresponding to the data "1") is applied to the bit line. In another example, when program data (for example, data "0") is stored in the data latch circuit 154_0, the bit line connection circuit 155_0 controls the bit line such that the voltage of the bit line discharged through a pre-program verify operation is maintained. In other words, the bit line connection circuit 155_0 blocks the connection of the bit line and the data latch circuit 154_0 such that the voltage of the bit line of the memory cell— determined as a memory cell to be programmed according to the data (that is, the data "0") stored in the data latch circuit 154_0—is maintained in the state discharged according to the pre-program verify operation.

Figure 4:
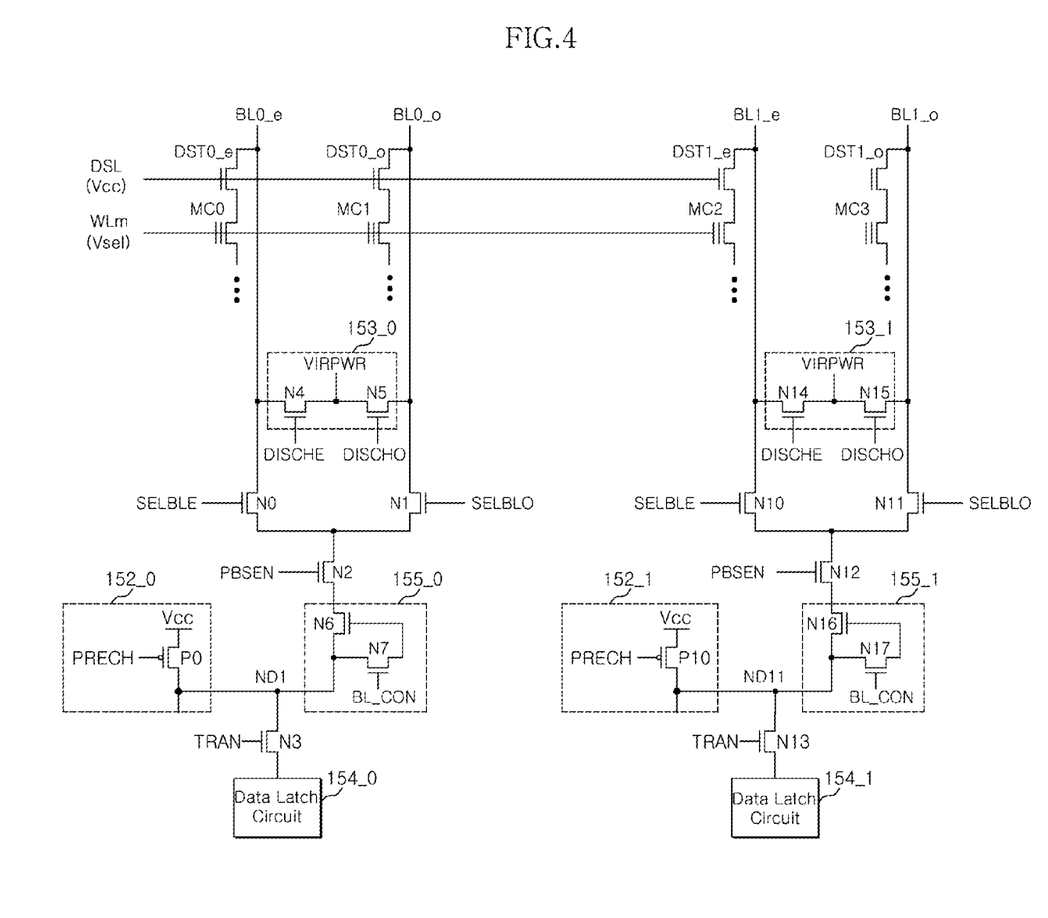
FIG. 4 is a circuit diagram exemplifying the data input/output circuit shown in FIG. 3.
Figure 5:
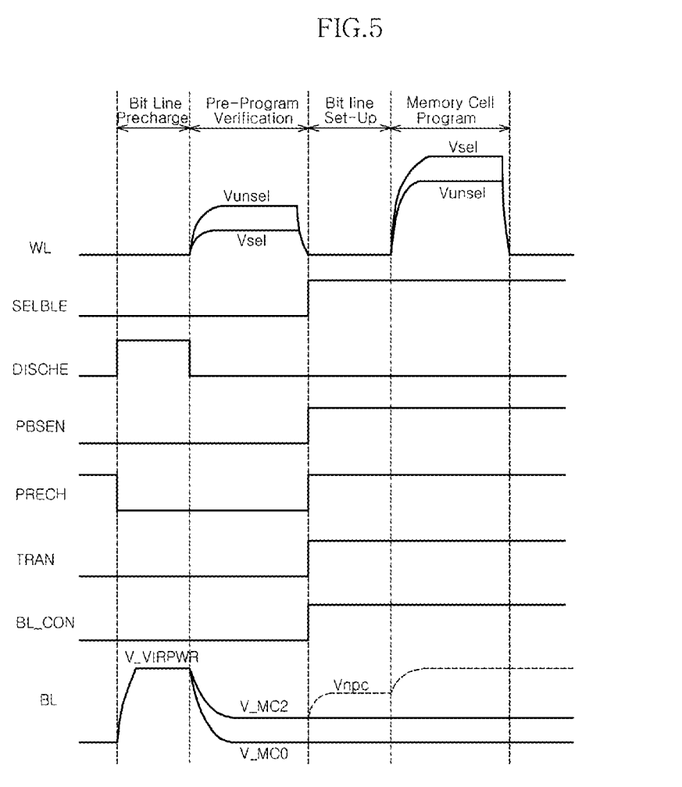
FIG. 5 is a timing diagram explaining a program operation of the data input/output circuit shown in FIG. 4.
Figure 6:
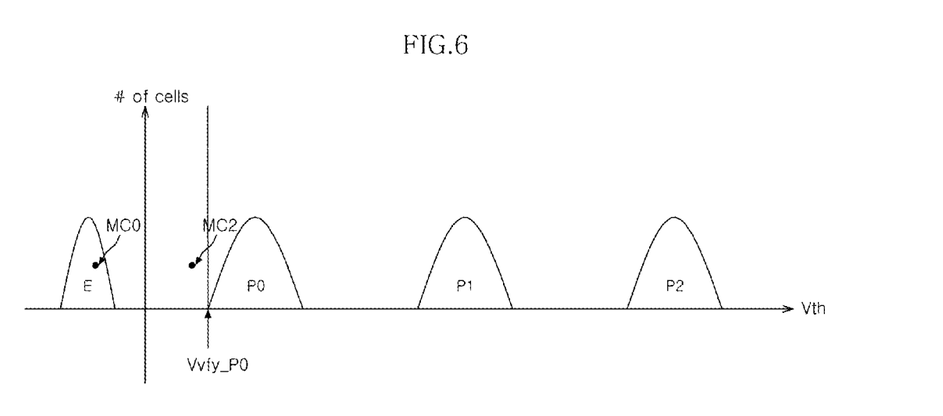
FIG. 6 is a graph showing threshold voltage distributions of memory cells, and explaining the program operation of the data input/output circuit shown in FIG. 4.

FIG. 4 is a circuit diagram exemplifying the data input/output circuit shown in FIG. 3. FIG. 5 is a timing diagram explaining a program operation of the data input/output circuit shown in FIG. 4. FIG. 6 is a graph showing threshold voltage distributions of memory cells, explaining the program operation of the data input/output circuit shown in FIG. 4. Hereinbelow, a program method of a nonvolatile memory device in accordance with another embodiment of the present invention will be described in detail with reference to the attached drawings.

Referring to FIG. 4, for the sake of simplification in explanation, four memory cells MC0 to MC3, which are disposed at crossing regions of bit lines BL0_e, BL0_o, BL1_e and BL1_0 and a word line WLm, will be illustrated. It is assumed that the memory cells MC0 and MC2 are even pages that are programmed to a first program state P0 (see FIG. 6). At this time, it is to be understood that the memory cells MC1 and MC3 are odd pages that are controlled to be inhibited from being programmed. It is assumed that the memory cells MC0 and MC2 undergo at least one program operation and have threshold voltage distributions as shown in FIG. 6.

In order to perform a program operation for the memory cells MC0 and MC2, a bit line precharge operation is performed. For example, transistors N0 and N10 are turned off by a SELBLE signal of a logic low state. Transistors N4 and N14 are turned on by a DISCHE signal of a logic high state. Under this situation, the bit lines BL0_e and BL1_e are precharged by a VIRPWR voltage. Meanwhile, transistors N2 and N12 are turned off by a PBSEN signal of a logic low state. Transistors N3 and N13 are turned off by a TRAN signal of a logic low state. Transistors P0 and P10 are turned on by a PRECH signal of a logic low state. Under this situation, nodes ND1 and ND11 (that is, SO nodes) are precharged by the level of a power supply voltage Vcc.

After the bit line precharge operation, a pre-program verify operation is performed. For example, a selected word line voltage Vsel (for example, a verification voltage) is applied to the selected word line WLm. The selected word line voltage Vsel applied to the selected word line WLm causes the bit lines BL0_e and BL1_e to be discharged according to the threshold voltages of the respective memory cells MC0 and MC2.

For example, referring to FIG. 6, since the memory cell MC0 has a threshold voltage lower than a verification voltage Vvfy_P0, the bit line BL0_e of the memory cell MC0 is fully discharged. As a result, a bit line voltage level V_MC0 of the memory cell MC0 is changed to the same voltage level as a ground voltage level. On the other hand, since the memory cell MC2 has a threshold voltage near the verification voltage Vvfy_P0, the bit line BL1_e of the memory cell MC2 is slightly discharged. As a result, a bit line voltage level V_MC2 of the memory cell MC2 is changed to a voltage level higher than the ground voltage and lower than a precharge voltage.

After the bit lines BL0_e and BL1_e of the memory cells MC0 and MC2 are set according to the threshold voltages of the memory cells MC0 and MC2, a bit line set-up operation is performed. For example, the transistors N0 and N10 are turned on by the SELBLE signal of a logic high level. The transistors P0 and P10 are turned off by the PRECH signal of a logic high level. The transistors N3 and N13 are turned on by the TRAN signal of a logic high level. Under this situation, the voltage levels of the nodes ND1 and ND11—precharged according to the data stored in data latch circuits 154_0 and 154_1—are changed.

In detail, in the case where data for causing the memory cells MC0 and MC2 not to be programmed, that is, data "1" is stored in the data latch circuits 154_0 and 154_1, the nodes ND1 and ND11 maintain precharged levels. At this time, as transistors N7 and N17 are turned on by a BL_CON signal of a logic high state and transistors N6 and N16 are turned on by the voltages of the nodes ND1 and ND11 of logic high states, the voltage levels of the bit lines BL0_e and BL1_e are changed to a program inhibition voltage Vnpc. On the other hand, when data for causing the memory cells MC0 and MC2 to be programmed, that is, data "0" is stored in the data latch circuits 154_0 and 154_1, the nodes ND1 and ND11 are discharged. At this time, as the transistors N7 and N17 are turned on by the BL_CON signal of the logic high state and the transistors N6 and N16 are turned off by the voltages of the nodes ND1 and ND11 of logic low states, the voltage levels of the bit lines BL0_e and BL1_e are maintained in the state precharged through the pre-program operation.

After the bit line set-up operation is completed, a programming operation for applying a program voltage to the memory cells MC0 and MC2 is performed. For example, a selected word line voltage Vsel (for example, a program voltage) is applied to the selected word line WLm. The memory cells MC0 and MC2 are programmed by the selected word line voltage Vsel applied to the selected word line WLm. At this time, the threshold voltage of the memory cell MC0 is substantially changed by the bit line voltage level V_MC0, which is charged to the same level as the ground voltage level. Conversely, the threshold voltage of the memory cell MC2 is changed slightly by the bit line voltage level V_MC2 higher than the ground voltage and lower than the precharge voltage. Namely, the bit line voltages of the memory cells MC0 and MC2 are differently set according to the respective threshold voltages of the memory cells MC0 and MC2 through the pre-program verify operation; consequently, an F-N tunneling effect occurring between the gates and the channels of the memory cells MC0 and MC2 may be controlled. According to this fact, the memory cells MC0 and MC2 may be programmed to have dense threshold voltage distributions.

While not shown in FIG. 5, it can be understood that a post-program verify operation may be performed after the programming operation is performed for the memory cells.

Figure 7:
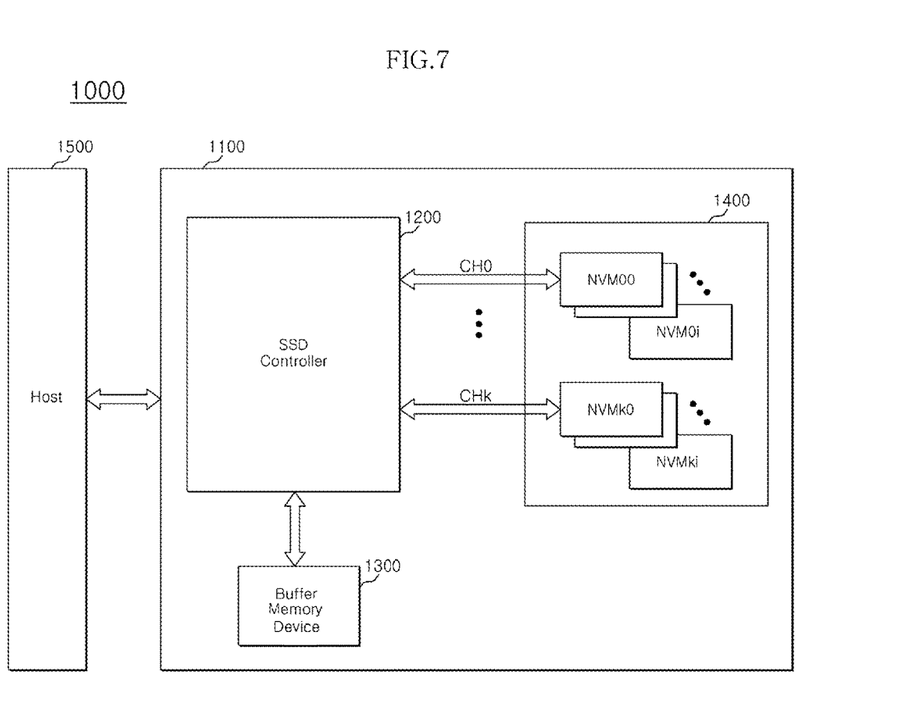
FIG. 7 is a block diagram exemplifying a data processing system including the nonvolatile memory device in accordance with an embodiment of the present invention.

FIG. 7 is a block diagram exemplifying a data processing system including the nonvolatile memory device in accordance with an embodiment of the present invention.

Referring to FIG. 7, a data processing system 1000 includes a data storage device 1100 and a host device 1500. The data storage device 1100 may be a solid state drive (SSD). The SSD 1100 includes an SSD controller 1200, a buffer memory device 1300 and a data storage medium 1400. The SSD 1100 according to the present embodiment of the invention may further include a temporary power supply circuit including super capacitors. Such a temporary power supply circuit may supply power so that the SSD 1100 may terminate normally when a sudden power-off occurs.

The SSD 1100 operates in response to an access request from the host device 1500. That is to say, the SSD controller 1200 is configured to access the data storage medium 1400 in response to an access request from the host device 1500. For example, the SSD controller 1200 is configured to control read, program and erase operations for the data storage medium 1400. The buffer memory device 1300 is configured to temporarily store data that is to be stored in the data storage medium 1400. Also, the buffer memory device 1300 is configured to temporarily store data that is to be read from the data storage medium 1400. The data stored in the buffer memory device 1300 is transmitted to the data storage medium 1400 or the host device 1500 under the control of the SSD controller 1200.

The SSD controller 1200 is connected with the data storage medium 1400 through a plurality of channels CH0 to CHk. A plurality of nonvolatile memory devices NVM00 to NVM0i~NVMk0 to NVMki are connected to the respective channels CH0 to CHk. The data storage medium 1400 is configured by the nonvolatile memory device (see the reference numeral 100 in FIG. 1) in accordance with an embodiment of the present invention. Accordingly, the reliability of the data of the SSD 1100 may be improved.

Figure 8:
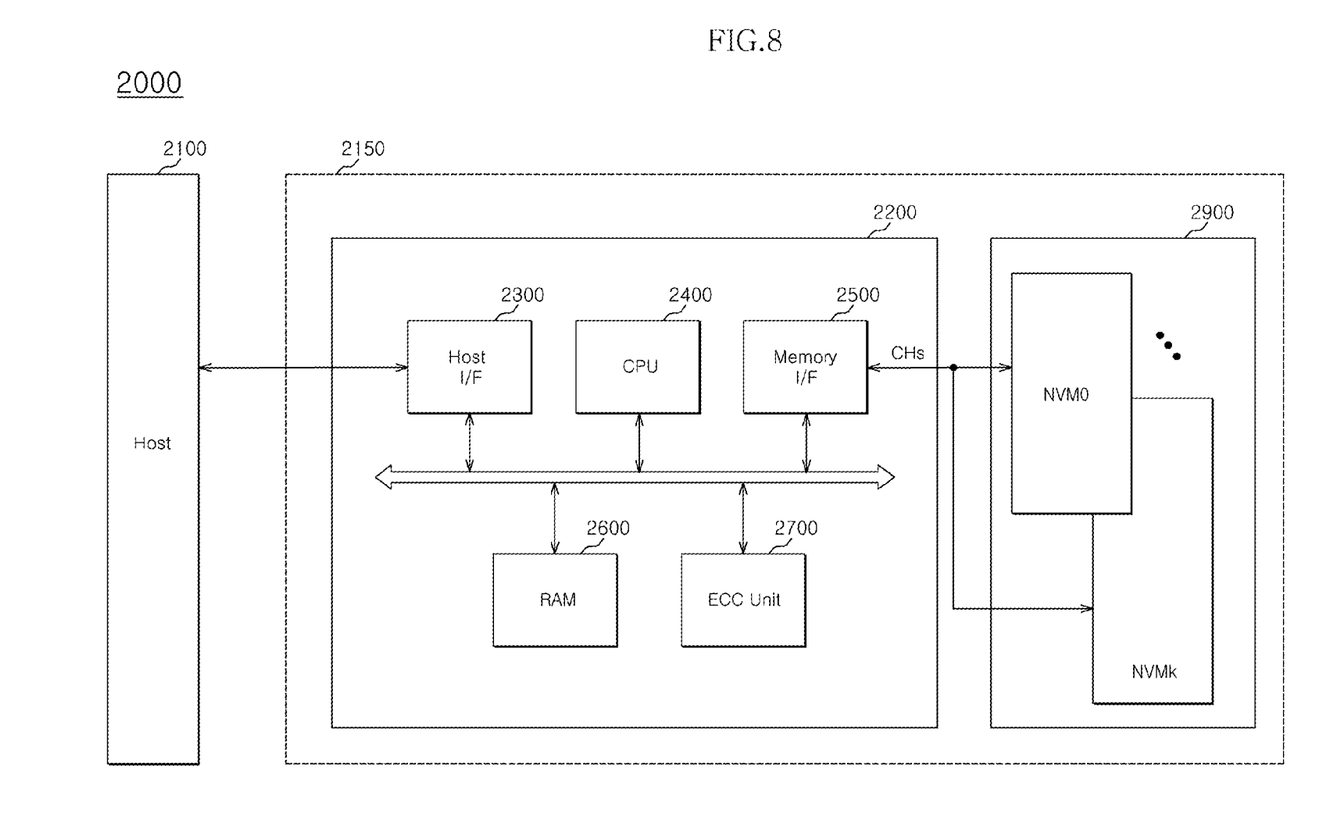
FIG. 8 is a block diagram exemplifying another data processing system including the nonvolatile memory device in accordance with the embodiment of the present invention.

FIG. 8 is a block diagram exemplifying another data processing system including the nonvolatile memory device in accordance with an embodiment of the present invention.

Referring to FIG. 8, a data processing system 2000 includes a host device 2100 and a data storage device 2150. The data storage device 2150 includes a controller 2200 and a data storage medium 2900. The data storage device 2150 may include the data storage medium 2900 which is constituted by a plurality of data storage media.

The controller 2200 is connected to the host device 2100 and the data storage medium 2900. The controller 2200 is configured to access the data storage medium 2900 in response to a request from the host device 2100. For example, the controller 2200 is configured to control read, program and erase operations for the data storage medium 2900. The controller 2200 is configured to provide an interface between the data storage medium 2900 and the host device 2100. The controller 2200 is configured to drive a firmware for controlling the data storage medium 2900.

The controller 2200 may include component elements well known in the art, such as a host interface 2300, a central processing unit 2400, a memory interface 2500, a RAM 2600 and an error correction code unit 2700. The RAM 2600 may be used as a working memory of the central processing unit 2400. The central processing unit 2400 controls the general operations of the controller 2200.

The host interface 2300 may include a protocol for performing exchange of data between the host device 2100 and the controller 2200. For example, the host interface 2300 may be configured to communicate with the host device 2100 through one of various interface protocols such as a USB (universal serial bus) protocol, an MMC (multimedia card) protocol, a PCI (peripheral component interconnection) protocol, a PCI-E (PCI-express) protocol, an ATA (advanced technology attachment) protocol, an SATA (serial ATA) protocol, an SCSI (small computer small interface) protocol, an ESDI (enhanced small disk interface) protocol and an IDE (integrated drive electronics) protocol.

The error correction code unit 2700 may be configured to detect and correct an error of data read from the data storage medium 2900. The memory interface 2500 may interface the data storage medium 2900 and the controller 2200. The data storage medium 2900 is constituted by the nonvolatile memory device (see the reference numeral 100 in FIG. 1) in accordance with an embodiment of the present invention. Accordingly, the reliability of the data of the data storage device 2150 may be improved.

The controller 2200 and the data storage medium 2900 may be integrated into one semiconductor device and may constitute a memory card. For example, the controller 2200 and the data storage medium 2900 may be integrated into one semiconductor device and may constitute a PCMCIA (personal computer memory card international association) card, a CF (compact flash) card, a smart media card, a memory stick, a multimedia card (MMC, RS-MMC, MMC-micro), an SD (secure digital) card (SD, Mini-SD, Micro-SD, SDHC), a UFS (universal flash storage) card, etc.

In another example, the controller 2200 or the data storage medium 2900 may be mounted to various types of packages. For example, the controller 2200 or the data storage medium 2900 may be packaged and mounted into a POP (package-on-package), a ball grid array (BGA), a chip scale package (CSP), a plastic leaded chip carrier (PLCC), a plastic dual in-line package (PDIP), a die in waffle pack, a die in wafer form, a chip on board (COB), a ceramic dual in-line package (CERDIP), a plastic metric quad flat package (MQFP), a thin quad flat package (TQFP), a small outline IC (SOIC), a shrink small outline package (SSOP), a thin small outline package (TSOP), a thin quad flat package (TQFP), a system in package (SIP), a multi-chip package (MCP), a wafer-level fabricated package (WFP), a wafer-level processed stack package (WSP), etc.

Figure 9:
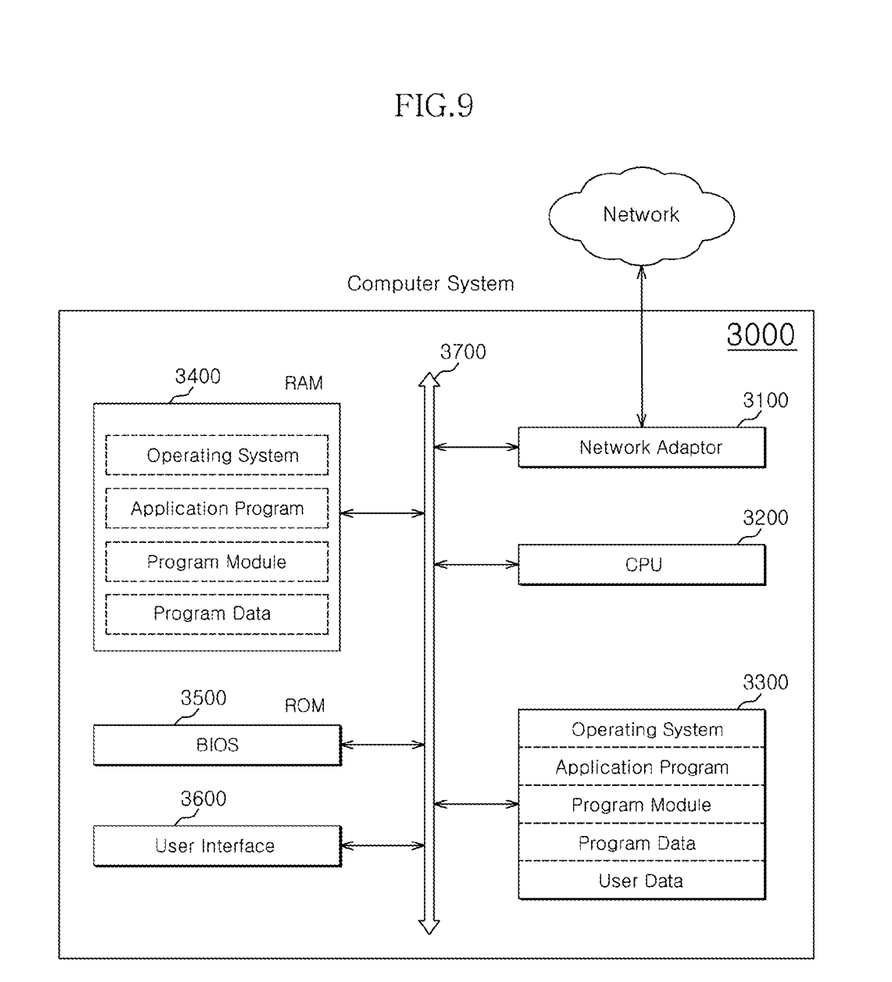
FIG. 9 is a block diagram exemplifying a computer system mounted with the data processing system shown in FIG. 7.

FIG. 9 is a block diagram exemplifying a computer system mounted with the data processing system shown in FIG. 7.

Referring to FIG. 9, a computer system 3000 includes a network adaptor 3100 which is electrically connected with a system bus 3700, a central processing unit 3200, a data storage device 3300, a RAM 3400, a ROM 3500, and a user interface 3600. The data storage device 3300 may comprise the data storage device 1100 of the data processing system 1000 shown in FIG. 7. Otherwise, the data storage device 3300 may comprise the data storage device 2150 of the data processing system 2000 shown in FIG. 8.

The network adaptor 3100 provides interfacing between the computer system 3000 and external networks. The central processing unit 3200 performs general arithmetic operations for driving an operating system or an application program residing in the RAM 3400. The data storage device 3300 stores all data needed in the computer system 3000. For example, the data storage device 3300 stores an operating system needed to drive the computer system 3000, an application program, various program modules, program data and user data.

The RAM 3400 may be used as a working memory of the computer system 3000. Upon booting, the operating system, the application program, the various program modules, and the program data needed for driving programs, which are read from the data storage device 3300, are loaded on the RAM 3400. A BIOS (basic input/output system) as a basic input/output system, which is activated before the operating system is driven upon booting, is stored in the ROM 3500. Information exchange between the computer system 3000 and a user is implemented through the user interface 3600.

Besides, the computer system 3000 may further include a battery and a modem. Also, while not shown in the drawing, the computer system according to the embodiment of the present invention may be further provided with an application chipset, a camera image processor (CIS), and a mobile DRAM.

According to embodiments of the present invention, the memory cells of a nonvolatile memory device may be programmed to have dense threshold voltage distributions.

While certain embodiments have been described above, it will be understood to those skilled in the art that the embodiments described are by way of example only. Accordingly, the nonvolatile memory device with improved reliability, the programming method thereof and the data processing system including the same described herein should not be limited based on the described embodiments. Rather, the nonvolatile memory device with improved reliability, the programming method thereof and the data processing system including the same described herein should only be limited in light of the claims that follow when taken in conjunction with the above description and accompanying drawings.

What is claimed is:

1. A nonvolatile memory device comprising:
   a memory cell connected with a bit line and a word line; and
   a data input/output circuit configured to precharge the bit line of the memory cell with a predetermined voltage, discharge the precharged bit line according to a threshold voltage of the memory cell when a selected word line voltage is applied to the word line, and maintain a voltage of the discharged bit line or apply a program inhibition voltage to the discharged bit line depending upon data to be stored in the memory cell regardless of the voltage of the discharged bit line, in a program operation.

2. The nonvolatile memory device according to claim 1, wherein the data input/output circuit comprises:
   a precharge circuit configured to precharge the bit line;
   a data latch circuit configured to temporarily store the data to be stored in the memory cell; and
   a bit line connection circuit configured to control connection of the bit line and the data latch circuit according to the data stored in the data latch circuit, in the program operation.

3. The nonvolatile memory device according to claim 2, wherein, in the case where program data is stored in the data latch circuit, the bit line connection circuit is configured to block the connection of the bit line and the data latch circuit such that the voltage of the discharged bit line is maintained.

4. The nonvolatile memory device according to claim 3, wherein the voltage of the bit line is maintained as a ground voltage, or a voltage which is higher than the ground voltage and lower than the predetermined voltage, according to the threshold voltage of the memory cell.

5. The nonvolatile memory device according to claim 2, wherein, in the case where erase data is stored in the data latch circuit, the bit line connection circuit is configured to allow the connection of the bit line and the data latch circuit.

6. The nonvolatile memory device according to claim 5, wherein the voltage of the bit line is maintained as the program inhibition voltage as the bit line and the data latch circuit are connected with each other.

7. A data processing system comprising:
   a nonvolatile memory device; and
   a controller configured to control the nonvolatile memory device,
   wherein the nonvolatile memory device comprising;
   a memory cell array including a memory cell disposed at a region where a word line and a bit line cross each other;
   a control logic configured to control a program operation and a read operation for the memory cell; and
   a data input/output circuit configured to precharge a bit line of the memory cell with a predetermined voltage under the control of the control logic, discharge the precharged bit line according to a threshold voltage of the memory cell when a selected word line voltage is applied to the word line, and maintain a voltage of the discharged bit line or apply a program inhibition voltage to the discharged bit line depending upon data to be stored in the memory cell regardless of the voltage of the discharged bit line, in the program operation.

8. The data processing system according to claim 7, wherein the data input/output circuit comprises:
   a precharge circuit configured to precharge the bit line;
   a data latch circuit configured to temporarily store the data to be stored in the memory cell; and
   a bit line connection circuit configured to control connection of the bit line and the data latch circuit according to the data stored in the data latch circuit, in the program operation.

9. The data processing system according to claim 8, wherein, in the case where program data is stored in the data latch circuit, the bit line connection circuit is configured to block the connection of the bit line and the data latch circuit such that the voltage of the discharged bit line is maintained.

10. The data processing system according to claim 9, wherein the voltage of the bit line is maintained as a ground voltage, or a voltage which is higher than the ground voltage and lower than the predetermined voltage, according to the threshold voltage of the memory cell.

11. The data processing system according to claim 8, wherein, in the case where erase data is stored in the data latch circuit, the bit line connection circuit is configured to allow the connection of the bit line and the data latch circuit.

12. The data processing system according to claim 11, wherein the voltage of the bit line is maintained as the program inhibition voltage as the bit line and the data latch circuit are connected with each other.

13. The data processing system according to claim 7, wherein the nonvolatile memory device and the controller comprise a memory card.

14. The data processing system according to claim 7, wherein the nonvolatile memory device and the controller comprise a solid state drive (SSD).

* * * * *